United States Patent [19]

Knotts

[11] Patent Number: 4,801,996

[45] Date of Patent: Jan. 31, 1989

[54] GIGAHERTZ RATE INTEGRATED CIRCUIT PACKAGE INCORPORATING SEMICONDUCTIVE MIS POWER-LINE SUBSTRATE

[75] Inventor: Thomas A. Knotts, Menlo Park, Calif.

[73] Assignee: Hewlett-Packard Company, Palo Alto, Calif.

[21] Appl. No.: 108,850

[22] Filed: Oct. 14, 1987

[51] Int. Cl.[4] .................. H01L 23/48; H01L 29/44; H01L 29/60; H05K 1/11

[52] U.S. Cl. .................................. 357/68; 357/71; 357/74; 357/80; 361/414

[58] Field of Search ............... 357/68, 71, 74, 80; 361/414

[56] References Cited

U.S. PATENT DOCUMENTS

| 4,432,007 | 2/1984 | Cady | 357/71 R |
| 4,484,215 | 11/1984 | Pappas | 357/74 |
| 4,685,998 | 8/1987 | Quinn et al. | 357/70 |

FOREIGN PATENT DOCUMENTS

| 0067358 | 6/1978 | Japan | 357/70 |
| 0152473 | 11/1979 | Japan | 357/70 |
| 0043831 | 3/1980 | Japan | 357/70 |
| 0092646 | 5/1985 | Japan | 357/71 |

OTHER PUBLICATIONS

IEEE Standard Dictionary of Electrical and Electronics Terms, Third Edition, 1984, p. 815.
CRC Handbook of Chemistry and Physics, 66th edition, 1985, pp. E-99 to E-102.
"A GaAs 12-Bit Digital-to-Analog Converter", by Hsieh, Knotts & Baldwin, CH 2182-4/85/0000-0187 1985 IEEE, pp. 187-190.

Primary Examiner—Eugene R. LaRoche
Assistant Examiner—Michael B. Shingleton

[57] ABSTRACT

An integrated circuit package suitable for gigahertz range operation with many power lines is provided with a separate power line structure comprising a uniformly and degenerately doped silicon substrate, a bifurcated thin-film insulator, and area-filling wedge-shaped power lines deposited over the insulator. This arrangement provides a high capacitance distributed right up to the die-interfacing region of the power lines. The effect is to minimize noise that could otherwise be introduced near the die-interfacing region at high frequencies. In addition, the power line structure provides a stable bias at the die-interfacing region of a separate signal line structure for resistive termination of digital signal lines.

12 Claims, 3 Drawing Sheets

GIGAHERTZ RATE INTEGRATED CIRCUIT PACKAGE INCORPORATING SEMICONDUCTIVE MIS POWER-LINE SUBSTRATE

BACKGROUND OF THE INVENTION

The present invention relates to packaging for integrated circuits and, more particularly, to integrated circuit packages suitable for operation at microwave compatible frequencies.

A major objective of the present invention is to provide circuit packaging including a large number, e.g., more than eight, of high quality power lines and signal lines to a digital-to-analog converter integrated circuit used at data rates on the order of one gigahertz (GHz). Conventional packages for high data rate integrated circuits use a sapphire substrate to carry both signal lines and power sources. For example, 50-ohm signal lines can be made with 10-mil wide gold traces deposited on the sapphire. Power is routed from the edge of the sapphire to the integrated circuit along dedicated lines. As close to the integrated circuit as possible, monoblock capacitors bypass these power lines to ground. The ground connections can be made using plated-through vias to a ground plane on the back of the sapphire.

Individual monoblock capacitors consume considerable area on the scale of the sapphire packaging. Where many such capacitors are required, they must be placed several millimeters from the integrated circuit chip. The monoblock capacitors are then connected by transmission lines to the chip. These transmission lines typically have impedances greater than 20 ohms, which can impede voltage stabilization after switching. Delays in voltage stabilization appear as noise at the device output and limit the ultimate speed of the integrated circuit. In addition, the high impedance transmission lines can introduce noise and cause cross-talk.

What is needed is a package for high speed integrated circuits which provides for large numbers of transmission and power lines. The power lines should permit rapid and relatively noise-free current switching.

SUMMARY OF THE INVENTION

The present invention provides a power line structure with a semiconductive substrate, plural power lines disposed parallel to the substrate, and an intermediate thin-film insulator capacitively coupling the power lines to the substrate. The semiconductive materials referred to herein are characterized by resistivities comparable to that of silicon when doped to or near carrier saturation, e.g., in the range of 0.001 to 0.01 $\Omega$.cm. The capacitance provided by the thin-film insulator is distributed over the area of each capacitively coupled power line.

This power line structure is designed to be the bottom of a two-part integrated circuit packaging scheme. An upper "signal" line structure can be a conventional high-speed sapphire substrate sandwiched between gold transmission lines and a gold conductor plane. The sapphire backside conductor plane can be insulated from the power lines by a layer of polyimide or other insulative material.

In one configuration, the power line structure is disk-shaped and most of the power lines are "pie" or wedge-shaped to maximize area utilization. A rectangular aperture can be cut through the center of the power line structure to accommodate an integrated circuit die. Die-interfacing contacts integral with the power lines are located adjacent to this aperture. These contacts are used for interfacing with bonding pads on an integrated circuit die via bonding wires.

The power line structure can be characterized as a metal-insulator-doped silicon, MIdS, structure. This MIdS structure is basically an MIS, metal-insulator-silicon, structure, but with the additional limitation that the silicon be degenerately doped. Preferably the capacitive coupling between the power lines and the semiconductive substrate comprises two layers of distinct insulating materials, such as silicon dioxide and silicon nitride, to minimize shorting due to pin-holes.

In some applications it is desired to "float" the sapphire backside conductor plane of the signal line structure at a potential other than ground for the package. To this purpose, one power line can be dedicated to the desired bias voltage. Where the other power lines are separated from the sapphire backside conductor plane with the polyimide insulating material, the dedicated power line can be coupled to the ground plane using silver epoxy or other conductive connecting material.

One advantage of the present invention is that the power line structure is well-suited for gigahertz rate power line switching. Since the signal lines for a gigahertz rated system require termination, a complete package for such an application can include terminating resistors coupling the signal lines to the sapphire backside conductive plane in the region near the die. Where the voltage of the ground plane is biased by the voltage of a dedicated power line extending into the die-interfacing region, the termination resistors are effectively AC coupled to system ground so noise is minimized.

The separation of power and signal lines into two layers provides for more total lines and more complex routing schemes. There is no necessity for conceptual purity in that lines of any type can be assigned to either layer. However, the semiconductive power line substrate provides very good transient response, probably due to the high capacitance distributed near the die-interfacing contacts. In addition, the moderate resistivity of the semiconductive material acts to dampen potential resonance in the power lines. These and other advantages are apparent in the discussion below with reference to the following drawings.

DESCRIPTION OF THE PREFERRED EMBODIMENTS

Figure 1:
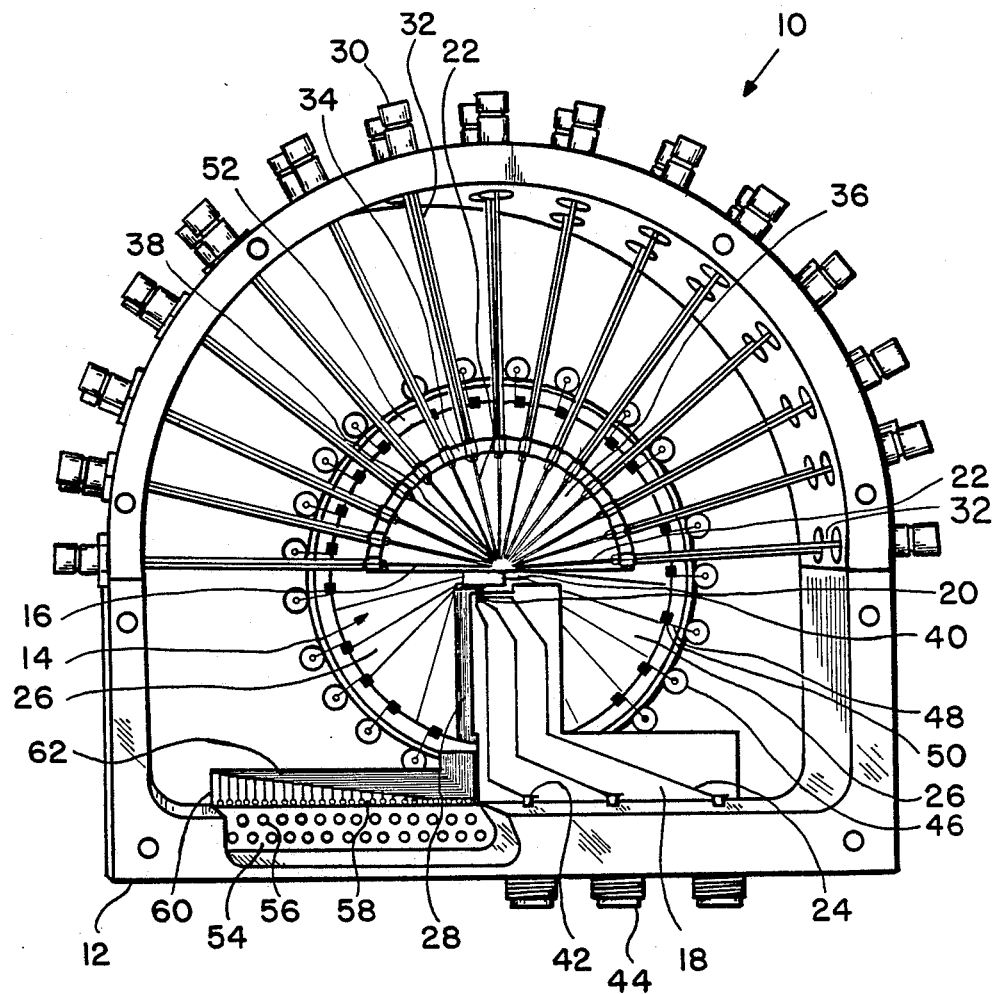
FIG. 1 is a perspective view of an integrated circuit package in accordance with the present invention.

An integrated circuit package 10 comprises a casing 12, a power line structure 14, a digital signal line structure 16, an analog signal line structure 18, and an integrated circuit die 20, as shown in FIG. 1. The illustrated die 20 is designed to convert digital signals at gigahertz rates to analog signals. The interfacing to implement this function includes digital signal lines 22, analog signal lines 24, power lines 26, and a DC bias and precision DC current line bus 28.

Digital signals, including data and clock signals, are input to the package 10 using a radial array of connectors 30 mounted on the casing 12. The connectors 30 are mounted in vertical pairs, each pair carrying a signal and its complement. The digital signals are directed from the connectors 30 along soldered pairs of coaxial transmission lines 32 which terminate at bonding pads 34 on the digital signal line structure 16. Bonding pads 34 serve as system interfacing contacts for digital signal line structure 16. The digital signal line structure 16 is semi-disk shaped and has a substrate 36 of sapphire or other material suited to gigahertz rate signal transmissions. Pairs of digital signal lines 22, in the form of gold traces on the sapphire substrate 36, couple the pairs of coaxial transmission lines 32 to integral die-interfacing contacts 38 near the semi-disk radius origin. Bonding wires provide the final digital links to the die 20.

The analog signal outputs of the die 20 reach the analog signal line structure 18 via wire bonds attached to die-interfacing contacts 40 integral with analog signal lines 24. The analog signal lines 24 terminate at contacts 42, which in turn are wire bonded to three coaxial connectors 44 on a flat wall of the casing 12.

The analog signal line structure 18 is similar to the digital signal line structure 16 in that both use gold traces on a sapphire substrate backed with a gold conductor. In both signal structures, the signal lines are terminated at die-interfacing contacts with tantalum nitride deposition resistors to the backside respective ground planes through a strap.

The power lines 26 are DC sources arranged circumferentially about the disk-shaped power line structure 14. The connectors 46 for the power lines 26 extend from below the casing. The power paths extend from these connectors 46 along wire bonds 48 to the power lines 26 on the power line structure 14. Each of these wire bonds 48 terminates at a capacitor 50 coupled to a ground ring 52 at the periphery of the power line structure 14. The capacitors 50 at the ground ring 52 as power-line-to-system-interfacing contacts which damp resonance for frequency components up to about 50 MHz.

Most of the power lines 26 on the power line structure 14 are wedge-shaped and extend to near the narrow sides of the rectangular die 20. These power lines 26 are wire-bonded to the die 20.

The precision currents and bias potentials interface with an external system using a downward facing connector 54. The terminals of the connector 54 are wire bonded to gold pads 58 on a narrow sapphire bus structure 60. Gold traces on this bus structure 60 define a 30-line system bus 62, which is linked to the precision-current bus 28. The precision current bus region is rectangular and extends to the same long side of the die 20 that provides interfacing for the analog outputs from die 20.

Figure 2:
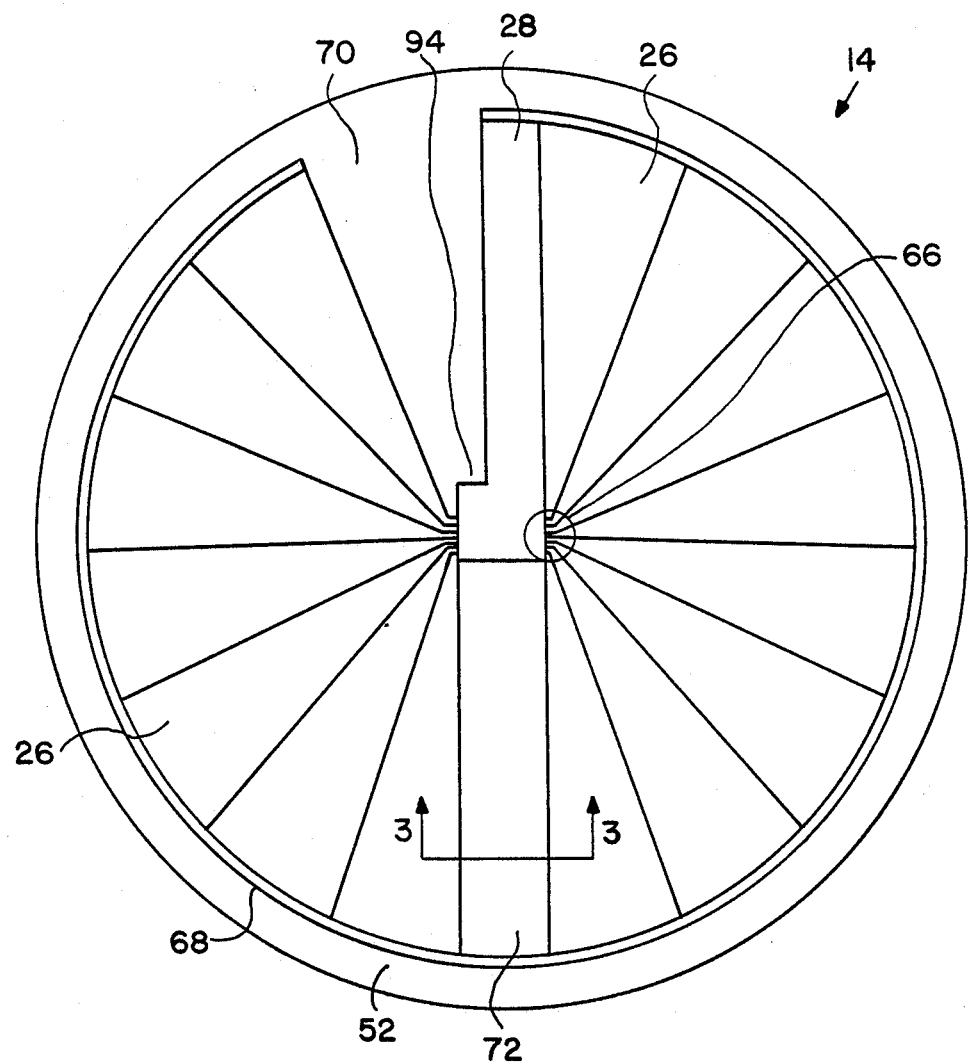
FIG. 2 is a plan view of a power line structure of FIG. 1.

The surface geometry of the power line structure 14 is indicated in FIG. 2, in which the ground ring 52, the precision current bus 28, and several wedge, or "pie", shaped power lines 26 are defined. The wedge-shaped power lines 26 terminate at integral die-interfacing contacts 66. A barrier structure 68 defining the ground ring 52 is broken at a ground wedge 70 to permit the casing ground electrical potential to be conveyed to the die 20. This ground wedge 70 maintains the conductive base of the L-shaped analog signal structure 24 at casing ground, at which voltage level the die-interfacing contacts 40 are terminated with 50Ω resistors.

Opposite the precision current bus 28 is a rectangular bias power line 72, which is dedicated to maintaining the sapphire backside conductor plane of the digital signal line structure 16 at a potential other than casing ground. The voltage applied to this power line 72 is the voltage to which the die interfacing contacts 38 of the digital signal structure 16 are resistively terminated.

Figure 3:
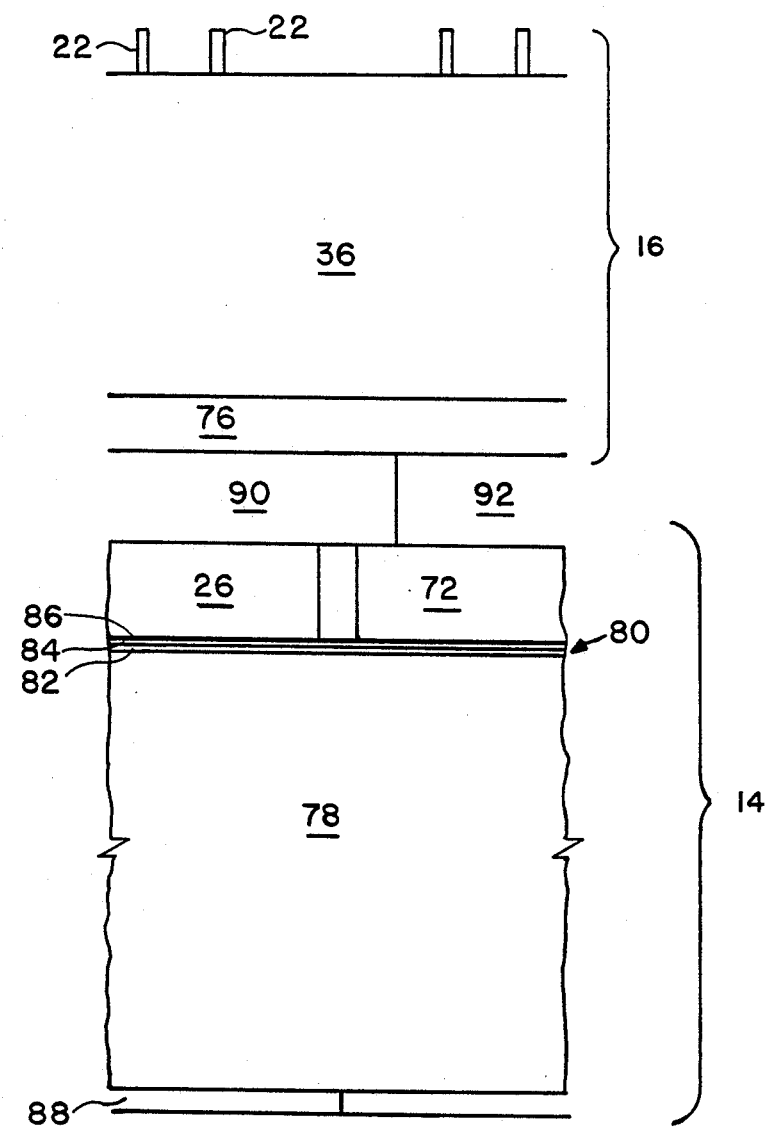
FIG. 3 is a sectional view of the power line structure of FIG. 2 shown in relation to a signal line structure of FIG. 1.

The electrical and physical relationships between the power line structure 14 and the digital signal line structure 16 are described with reference to FIG. 3, which depicts a section through the digital signal line structure 16 and the power line structure 14 at the location indicated by line 3—3 in FIG. 2. The digital signal line structure 16, like the analog signal line structure 18 and the bus structure 60, is a conventional gigahertz frequency sapphire substrate design with gold traces for signal lines 22 on a top surface of the sapphire substrate 36 and a gold ground plane 76 on the bottom surface of the sapphire substrate 36. Adhesion of the gold lines and plane to the sapphire substrate 36 can be secured with an intermediate material such as chromium or tantalum nitride. In the present embodiment, the sapphire substrate 36 is about 10 mils thick, and the gold line and plane depositions are about 3 μm, with 1000 Å adhesion layers, as is known in the art.

The power line structure 14 has a uniformly and degenerately doped silicon substrate 78. The dopant in the illustrated silicon substrate 78 is boron. Sufficient boron is in the silicon to yield a resistivity of 0.01 Ω.cm. Herein, the silicon substrate 78 is referred to as "semiconductive" in that it is more conductive than un-doped or lightly doped semiconductor material, but more resistive than most metal conductor materials. Numerically, the range of resistivities for substrate 78 can be between 0.001 and 0.1 Ω.cm. The illustrated silicon substrate 78 is about 20 mils thick.

An insulator material 80 is deposited on the semiconductive substrate 78 using conventional semiconductor processing thin-film deposition methods. The insulator in the illustrated power line structure 14 is bifurcated. A lower layer 82 of is of silicon dioxide, about 3000 Å thick, while an upper layer 84 is of silicon nitride, about 2500 Å thick. This bifurcated structure minimizes unintended electrical paths through the insulator 80. Each layer can have defects or pin-holes through which electric current could flow. However, the chance that defects in dissimilar materials would align is small, reducing the likelihood than an electrical path will extend through both materials. A layer 86 of tantalum nitride, about 500 Å thick, is deposited over the silicon nitride layer 84 to facilitate adhesion of the power lines 26, and 72 which consist of 8 μm thick gold deposition electrically isolated by air-filled gaps 87.

As in the case of the signal line structure 16 ad 18, the bottom side of the power line structure 14 is coated with gold. However, this gold plane 88 does not serve as the ground plane for the power line transmissions. This function is served primarily by the semiconductive substrate 78 itself. The gold plane 88 is used to couple the semiconductive substrate 78 electrically and physically to the casing 12.

A polyimide sheet 90, about 1 mil thick, is disposed between and electrically isolates the floating ground plane 76 of the digital signal line structure 16 and most of the power lines 26 of the power line structure 14. A similar polyimide is used under part of the L-shaped analog signal line structure 18. However, the rectangular power line 72 is not covered with polyimide, but with a silver epoxy layer 92, also about 1 mil thick. The silver epoxy layer 92 is used to form an electrical connection between the rectangular power line 72 and the floating ground plane 76 of the digital signal line structure 16. A similar silver epoxy layer electrically and physically couples the wedge-shaped ground plane 70 to the gold ground plane of the L-shaped analog signal structure 18.

The integrated circuit package 10 described above provides improved gigahertz range performance, as indicated by time-delay reflectometry (TDR) testing. By way of explanation, and not of limitation, the following theorectical discussion is presented.

One of the requirements for power lines in a radio frequency range package is that power lines should be by-passed to ground close to the interface with the integrated circuit die. Otherwise, transients and noise can adversely affect device performance. The higher the switching or data rate, the closer the required capacitance needs to be to the die interface. However, the capacitors required for by-passing consume area in proportion to their capacitance. When a large number of power lines is required, each requiring a capacitor, it becomes necessary to space the individual capacitors radially from the die interface. Thus, for greater switching rates and greater numbers of power lines, there is difficulty in obtaining sufficient capacitance close to the die interface.

The illustrated power line structure 14 attacks this problem in two ways. The use of the semiconductive substrate 78 and insulating thin-film layers 82 and 84 provide vastly improved capacitance per unit area. Capacitance is proportional to area and dielectric constant of the insulator and inversely proportional to the thickness of the insulator. The thin-film insulator 80 provides a very thin, e.g., about 0.6 $\mu$m, insulator with a dielectric constant of about 6.

Moreover, in the power line structure 14, the capacitance is distributed rather than localized. In particular, it is distributed right up to the die-interfacing contacts 66. Thus, any transients emanating from a die interface and along a power line, "experience" some capacitance immediately, and increasing capacitance as it progresses along the power line. The transients are not permitted to traverse a length of transmission line before encountering localized capacitance, as in conventional arrangement for power lines. Thus, the present invention provides high overall capacitance and capacitance distributed to areas where it is needed most.

Another advantage of the power line structure 14 is that the small resistivity of the semiconductive substrate 78 reduces the resonator quality of, i.e., it "de-Qs", the power lines 26. Potential reflections are quickly damped so that standing waves are not established. This minimizes ringing, which would appear as noise in the output of the overall package 10.

The distributed capacitance insures to the benefit of the signal lines 22 and 24 as well. In the present package 10, and in general, signal lines need to be resistively coupled to a constant potential at the die interface. Variations in the voltage to which the transmission lines are resistively coupled can introduce noise into the device.

One approach is to couple the ground plane of a sapphire structure to casing ground. However, if sufficient care is not taken to deliver a stable potential to the die-interfacing region, voltage non-uniformities caused at high frequencies can distort the voltage to which individual resistors are tied. Another problem is that casing ground is not necessarily at the preferred voltage to which to tie the signal transmission lines.

The present package 10 addresses these problems using the rectangular power line 72 which extends to the region beneath the die-interfacing contacts 38 of the digital signal line structure 16. This power line 72 is physically and electrically coupled to the floating ground plane 76 of the digital signal line structure 16 with the silver epoxy layer 92. Thus, the rectangular power line 72 can provide a selected bias to the floating ground plane 76.

Furthermore, the rectangular power line 72 is capacitively coupled over its entire area, including the area in the die-interfacing region. This arrangement ensures that the selected potential is applied to the floating ground plane 76 where the resistive connections are made. It further insures that these resistive connections are AC coupled to the semiconductive substrate 78. Thus, the present invention provides for a very stable bias at which digital transmission lines can be resistively terminated.

Similar termination considerations apply to the analog signal lines 24, except that there is no requirement for a bias from casing ground. Accordingly, the wedge-shaped ground line 70 includes a "lapel" 94 which is electrically and physically coupled to the L-shaped analog sigal line structure 18 using silver epoxy. Thus, the analog signal lines 24 are resistively coupled to a stable ground potential and AC coupled to the semiconductive substrate 78 below the die-interfacing region of the analog signal structure 18.

Thus, the present invention provides for an integrated circuit package with a multitude of power lines suitable for gigahertz switching rates, and has advantages for transmission line terminations as well. A great variety of packaging geometries are provided for as well. Different insulating, conductive and semiconductive materials can be substituted. The resistivity of the semiconductive material can be varied within appropriate limits. Other variations and modifications are provided for by the present invention, the scope of which is limited only by the following claims.

What is claimed is:

1. A structure comprising:
   a disk-shaped semiconductive substrate;
   plural power lines, each including and electrically coupling a power-line-to-system-interfacing contact and a power-line-to-die-interfacing contact, each power line extending parallel to said semiconductive substrate, each said power-line-to-die-interfacing contact being positioned and adapted for interfacing with an integrated circuit die, at least some of said power lines being wedge shaped so as to terminate at their narrow ends at said power-line-to-die-interfacing contacts, said power-line-to-die-interfacing contacts being disposed about a region for accommodating a integrated circuit die near the radial center of the substrate; and
   thin-film insulator material capacitively coupling at least some of said power lines and their respective power-line-to-die-interfacing contacts to said semiconductive substrate.

2. The structure of claim 1 wherein one of said power lines is generally rectangular.

3. The structure of claim 1 further comprising a ground ring of conductive material formed on said semiconductive substrate so as to be electrically coupled thereto.

4. The structure of claim 1 wherein one of said power lines is electrically coupled to said semiconductive substrate.

5. The structure of claim 1 wherein said semiconductive substrate includes degenerately doped silicon.

6. The structure of claim 1 wherein said thin film insulator material includes two layers of different insulating materials.

7. A structure comprising:
a semiconductive substrate;
plural power lines, each including and electrically coupling a power-line-to-system-interfacing contact and a power-line-to-die-interfacing contact, each power line extending parallel to said semiconductive substrate, each said power-line-to-die-interfacing contact being positioned and adapted for interfacing with an integrated circuit die;
thin-film insulator material capacitively coupling at least some of said power lines and their respective power-line-to-die-interfacing contacts to said semiconductive substrate;
a signal line substrate disposed parallel to said semiconductive substrate; signal lines disposed on said signal line substrate, said signal lines including and electrically coupling signal-line-to-system-interfacing contacts and signal-line-to-die-interfacing contacts;
a ground plane disposed on said signal line substrate so that said signal line substrate is between said ground plane and said signal lines; and
intermediate insulator material spacing and insulating said ground plane on said signal lines substrate from at least some of said power lines.

8. The structure of claim 7 further comprising means for resistively coupling said signal-line-to-die-interfacing contacts to said ground plane at a die-side-region of said ground plane.

9. The structure of claim 8 further comprising bias means for electrically coupling said ground plane to a first of said power lines.

10. The structure of claim 9 wherein said bias means includes means for coupling said die-side region of said ground plane to said first power line.

11. The structure of claim 7 wherein said signal line substrate consists primarily of sapphire.

12. The structure of claim 8 wherein said semiconductive substrate is disk shaped, some of said power lines being wedge shaped so as to terminate at their narrow ends at said power-line-to-die-interfacing contacts, said power-line-to-die-interfacing contacts being disposed about a region for accommodating an integrated circuit die near the radial center of the substrate.

* * * * *